(12) United States Patent
Tsai et al.

(10) Patent No.: US 12,270,847 B2
(45) Date of Patent: Apr. 8, 2025

(54) ANTENNA TEST SYSTEM

(71) Applicant: QuantumZ Inc., Kaohsiung (TW)

(72) Inventors: Meng-Hua Tsai, Tainan (TW);
Wei-Ting Lee, Kaohsiung (TW);
Chun-Yen Wang, Kaohsiung (TW);
Wei-Cheng Lin, Taipei (TW)

(73) Assignee: QuantumZ Inc., Kaohsiung (TW)

( * ) Notice: Subject to any disclaimer, the term of this patent is extended or adjusted under 35 U.S.C. 154(b) by 217 days.

(21) Appl. No.: 18/315,486

(22) Filed: May 10, 2023

(65) Prior Publication Data

US 2023/0366918 A1 Nov. 16, 2023

(30) Foreign Application Priority Data

May 11, 2022 (TW) .................................. 111117689

(51) Int. Cl.
*G01R 29/10* (2006.01)
*G01R 29/08* (2006.01)

(52) U.S. Cl.
CPC ..... *G01R 29/0871* (2013.01); *G01R 29/0821* (2013.01); *G01R 29/0878* (2013.01); *G01R 29/10* (2013.01)

(58) Field of Classification Search
CPC ............ G01R 29/0871; G01R 29/0821; G01R 29/0878; G01R 29/10; G01R 29/105; G01R 1/0408
See application file for complete search history.

(56) References Cited

U.S. PATENT DOCUMENTS 11,579,178 B1 * 2/2023 Lee ..................... G01R 29/0871
2023/0033833 A1 * 2/2023 Maruo ................. G01R 29/105

* cited by examiner

*Primary Examiner* — David E Lotter
(74) *Attorney, Agent, or Firm* — CKC & Partners Co., LLC

(57) ABSTRACT

An antenna test system includes a box body, a supporting device, at least one probe device, a signal measuring device, and a moving device. The box body has at least an operation side configured to be opened to allow access to devices inside the box body. The supporting device is disposed in the box body and the antenna circuit to be tested is arranged thereon. The probe device is disposed in the box body and configured to apply an antenna testing signal to the antenna circuit to emit an antenna working signal. The signal measuring device is disposed in the box body to receive the antenna working signal emitted from the antenna circuit. The moving device is disposed in the box body and configured to carry the signal measuring device to maneuver in three directions of X-axis, Y-axis, and Z-axis to receive the antenna working signal in different positions.

15 Claims, 9 Drawing Sheets

ANTENNA TEST SYSTEM

RELATED APPLICATIONS

This application claims priority to Taiwan Application Serial Number 111117689, filed May 11, 2022, which is herein incorporated by reference.

BACKGROUND

Field of Invention

The present invention relates to an antenna test system.

Description of Related Art

As the development of a wireless communication technology, various electronic products, such as smart phones and tablet computers, provide the wireless communication function to meet human needs. In order to enhance the wireless communication performance of the electronic products, the industry has designed various antenna devices to improve the wireless communication quality of the electronic products. Antenna devices are tested to determine whether the antenna devices can operate according to specifications. However, existing antenna device test needs to be carried out in a laboratory and requires a larger space and complicated operations.

Therefore, an antenna test system is needed to integrate various test devices in the laboratory, to reduce the required space, and to simplify the operation of antenna device testing, thereby improving the efficiency of antenna device testing and decreasing the time and space cost of antenna device testing.

SUMMARY

The present invention provides an antenna test system, which integrates various instruments into a box body, so that the efficiency of antenna device testing is improved, and the time and space cost of antenna device testing is reduced.

According to the embodiments of the present invention, the antenna test system includes a box body, a supporting device, at least one probe device, a signal measuring device, and a moving device. The box body has an operation side with an opening that may be opened movably. The supporting device is disposed in the box body and configured to carry an antenna circuit to be tested. The probe device is disposed in the box body and configured to apply an antenna testing signal to the antenna circuit to be tested to emit an antenna working signal. The signal measuring device is disposed in the box body and configured to receive the antenna working signal emitted from the antenna circuit to be tested. The moving device is disposed in the box body and configured to carry the signal measuring device and to at least maneuver in three directions of X-axis, Y-axis, and Z-axis to make the signal measuring device receive and scan the antenna working signal through different positions.

In some embodiments, the antenna test system further includes: at least one first slide rail and a carrier plate. The first slide rail is disposed on at least one side wall of the box body and extends along a direction toward the opening of the box body. At least one end of the carrier plate is disposed on the first slide rail to move along the first slide rail. The carrier plate carries the supporting device and the probe device, and when the carrier plate moves toward the opening of the box body along the first slide rail, at least one portion of the carrier plate, the supporting device, and the probe device are exposed outside the box body.

In some embodiments, the moving device includes a second slide rail disposed on an upper portion of the box body. The signal measuring device is disposed on the second slide rail to move to different positions via the moving device to receive the antenna working signal.

In some embodiments, the supporting device and the probe device are disposed on an upper portion of the box body.

In some embodiments, the moving device includes a slide rail disposed on a lower portion of the box body. The signal measuring device is disposed on the slide rail to move to different positions to receive the antenna working signal.

In some embodiments, the antenna test system further includes a mobile observation platform disposed outside the box body and configured to carry at least one microscopic observation device to check whether the probe device contacts the antenna circuit for testing is correct. When observing the antenna circuit to be tested, the mobile observation platform extends into the box body via the opening of the box body. After observing the probe device contacts the antenna circuit to be tested correctly, the mobile observation platform exits the box body via the opening.

In some embodiments, the mobile observation platform further includes a Y-shaped support arm, where two support bases extend from the Y-shaped support arm, and the support bases respectively carry a front-view microscope and a rear-view microscope.

In some embodiments, the mobile observation platform further includes a rotatable support arm, and the rotatable support arm carries the microscope to rotate between a front-view position and a rear-view position.

In some embodiments, the moving device further includes an anti-vibration device for preventing vibration generated when the signal measuring device is being moved by the moving device from affecting the supporting device.

In some embodiments, the carrier plate further includes an anti-vibration device for preventing the supporting device from being affected by external vibration of the box body.

In some embodiments, the antenna test system further includes a lifting device, and the lifting device is disposed on the carrier plate to carry the supporting device and configured to adjust a Z-axis coordinate position of the antenna circuit to be tested.

In some embodiments, a rotating mechanism is provided between the carrier plate and the lifting device, so that the lifting device can be rotated around a Z axis to adjust the angle of the antenna circuit to be tested.

DETAILED DESCRIPTION

Figure 1:
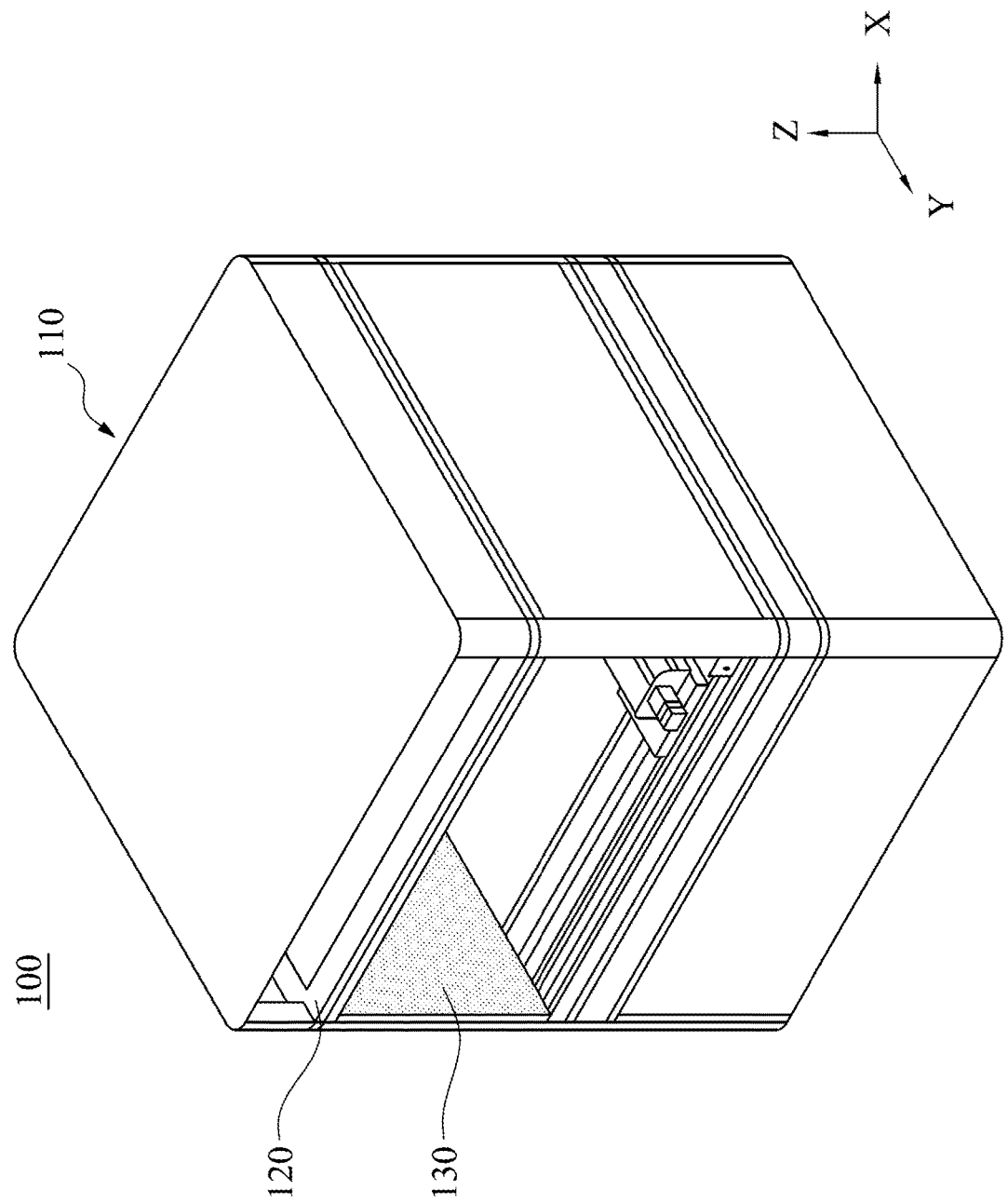
FIG. 1 and FIG. 2 are schematic diagrams showing a structure of an antenna testing system in accordance with one embodiment of the present invention.
Figure 2:
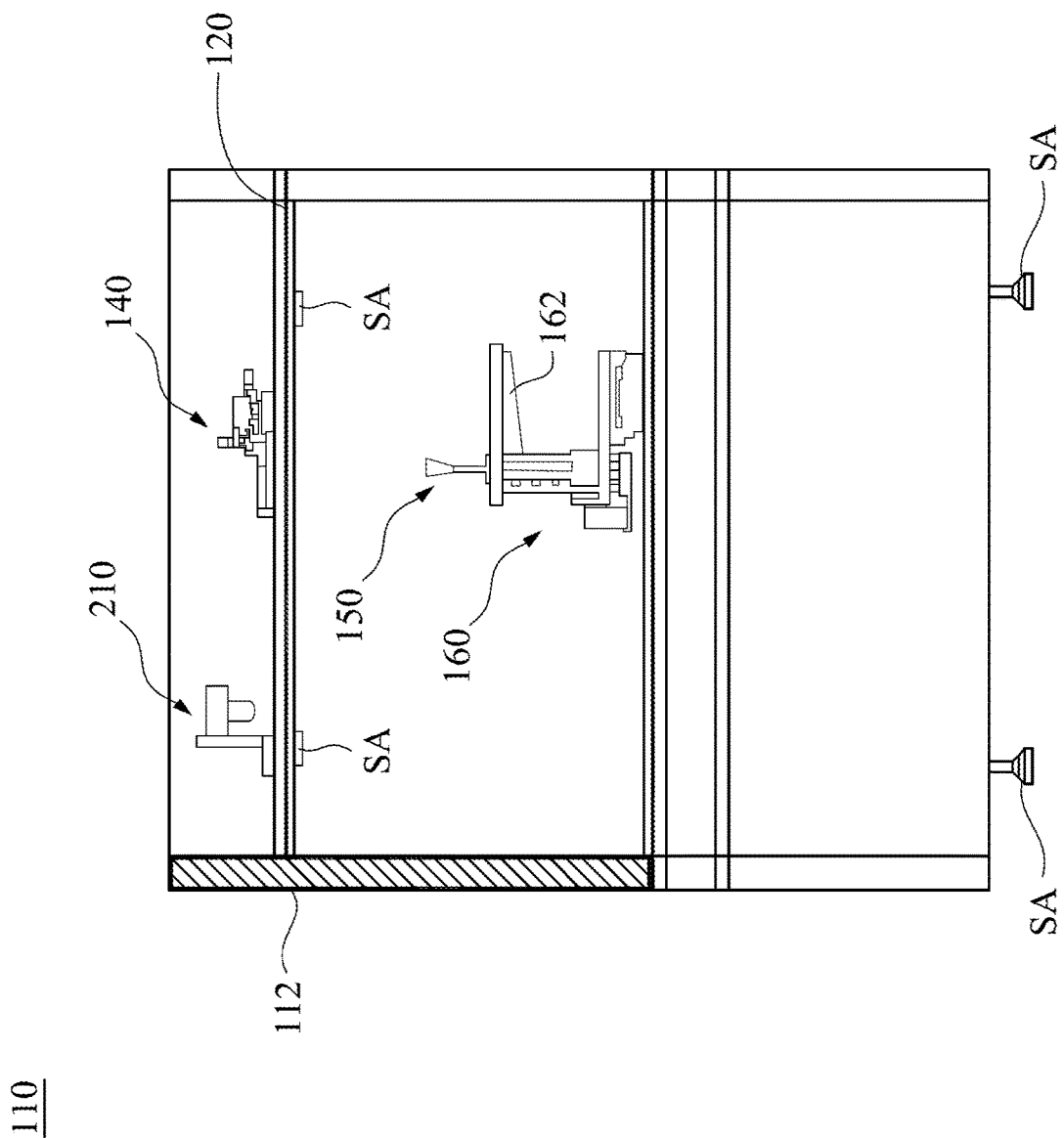

Referring to FIG. 1 and FIG. 2, schematic diagrams showing a structure of an antenna testing system 100 in accordance with one embodiment of the present invention. The antenna testing system 100 includes a box body 110, a carrier plate 120, an absorbing material 130, a probing arm 140, a signal measuring device 150, a moving device 160, and anti-vibration devices SA. The box body 110 is used for accommodating devices required for testing an antenna, and an inner surface of the box body 110 is provided with the absorbing material 130 to absorb electromagnetic waves. The box body 110 has at least an operation side 112 for a user to put an antenna circuit to be tested in the box body 110. For example, the operation side 112 may be provided with an opening, which can be opened to allow the user to place the antenna circuit to be tested into the box body 110. In this embodiment, the operation side 112 includes a movable side door to provide the opening, but the embodiments of the present invention are not limited thereto.

The carrier plate 120 is used to carry the antenna circuit to be tested. For example, when the operation side 112 is opened, a portion of the carrier plate 120 is moved outside the box body 110 through the opening and exposed for user convenience, such that the user can easily place the antenna circuit to be tested on the portion of the carrier plate 120 outside the box body 110. In the present embodiment, the carrier plate 120 is moved through slide rails. For example, at least one slide rail is disposed on a side wall of the box body 110 and extends along a direction toward the operation side 112 (the opening) of the box body 110. At least one end of the carrier plate is arranged on the slide rail to move along the slide rail. Thus, when the operation side 112 is opened, a portion of the carrier plate 120 can be exposed outside the box body 110 through the opening.

The probing arm 140 is disposed in the box body 110 and located above the carrier plate 120 to use a probe device to apply an antenna test signal to the antenna circuit to be tested on the carrier plate 120, so that the antenna circuit to be tested sends out an antenna working signal correspondingly. In this embodiment, the probing arm 140 may be moved in the X-Y plane by, for example, a slide rail arranged on an upper wall of the box body 110 to adjust the position of probing.

The signal measuring device 150 is disposed in the box body 110 and located under the carrier plate 120. The signal measuring device 150 is used to measure the antenna working signal sent by the antenna circuit to be tested. In this embodiment, the signal measuring device 150 is a horn antenna, but the embodiments of the present invention are not limited thereto.

Figure 3:
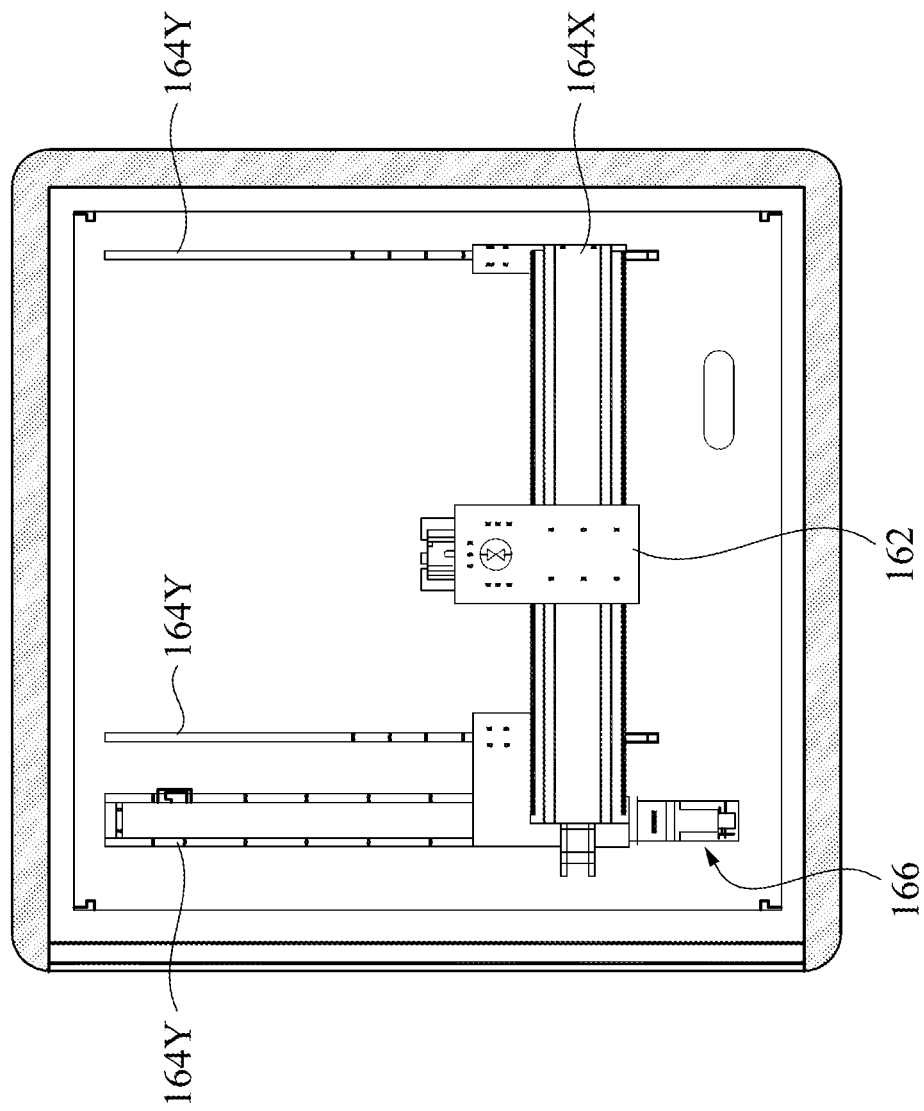
FIG. 3 is a schematic diagram showing a slide rail structure of a moving device in accordance with one embodiment of the present invention.

The moving device 160 is disposed in the box body 110 and located under the carrier plate 120. The moving device 160 is used to carry the signal measuring device 150, so that the signal measuring device 150 may move in three directions of X-axis, Y-axis, and Z-axis. For example, the moving device 160 includes a Z-axis lifting platform 162, which controls the height of the signal measuring device 150 in the box body 110. Further, as shown in FIG. 3, the moving device 160 includes slide rails 164X and 164Y, and the Z-axis lifting platform 162 is disposed on the slide rails 164X and 164Y, so that the moving device 160 may carry the signal measuring device 150 to move on the X-Y plane, wherein a motor 166 is used to drive the moving device 160 to move in the three directions of X-axis, Y-axis, and Z-axis.

Figure 4:
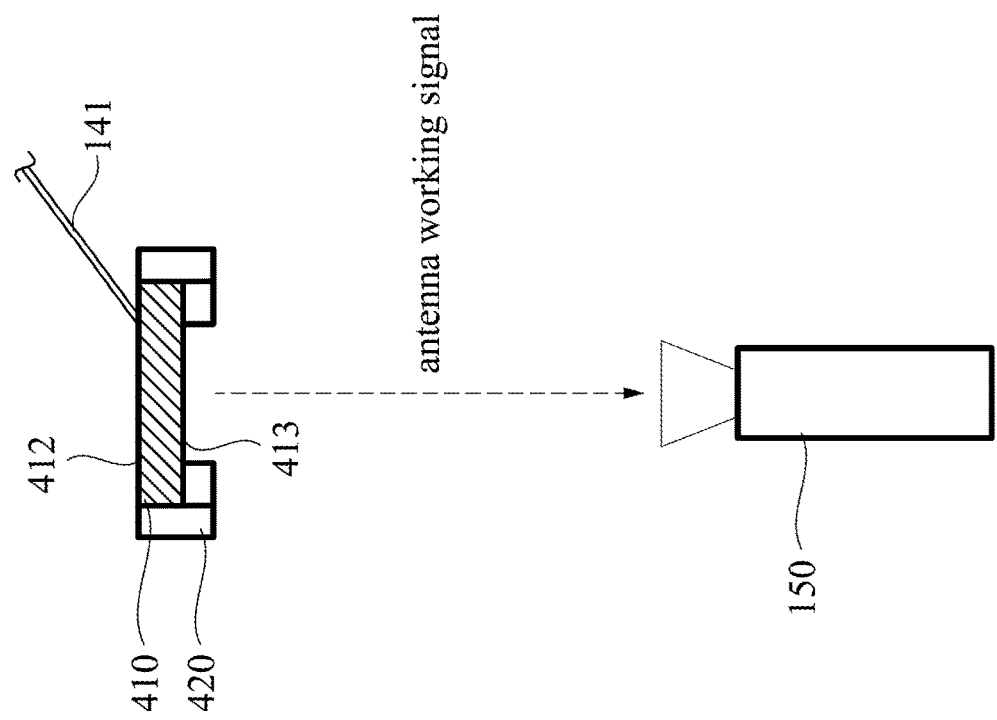
FIG. 4 is a schematic diagram showing an operation of antenna measurement in accordance with one embodiment of the present invention.

Referring FIG. 4, a schematic diagram showing an operation of antenna measurement in accordance with one embodiment of the present invention. As shown in FIG. 4, a probe device 141 applies the antenna test signal to the antenna circuit 410 to be tested, so that the antenna circuit to be tested emits the antenna working signal. In this embodiment, the antenna circuit 410 to be tested is arranged on a supporting device 420, wherein the supporting device 420 may be, for example, a fixture, and a bottom of which has an opening to expose a bottom 413 of the antenna circuit 410 to be tested. Although the probe device 141 of the present embodiment contacts a top 412 of the antenna circuit 410 to be tested to apply the antenna test signal to the antenna circuit 410 to be tested, the embodiments of the present invention are not limited thereto. In other embodiments of the present invention, the probe device 141 may contact the bottom 413 of the antenna circuit 410 to be tested through the opening of the supporting device 420 to apply the antenna test signal from the bottom 413 of the antenna circuit 410 to be tested. Such configurations provide flexibilities for testing any type of antenna without customized fixtures.

After applying the antenna test signal to the antenna circuit 410 to be tested, the antenna circuit 410 to be tested radiates the working signal through the antenna, and the signal measuring device 150 moves to different positions (XYZ coordinates) according to a predetermined time sequence to measure the antenna working signal sent by the antenna circuit 410 to be tested, such that a strength of the antenna working signal corresponding to each of the XYZ coordinates may be obtained and collected to achieve scanning. In some embodiments, the strength of the antenna working signal corresponding to each of the XYZ coordinates can be scanned and calculated by a computer using an algorithm, such that the measured near-field strength of the antenna is converted to further obtain a far-field radiation pattern of the antenna circuit 410 to be tested.

In some embodiments, the volume of the antenna circuit 410 to be tested is very small. In order to ensure that the probe device 141 accurately applies the antenna test signal to the predetermined position on the antenna circuit 410 to be tested, the antenna test system 100 further includes a microscope 210, so that the microscope 210 may be used to observe whether the probe device 141 contacts the antenna circuit 410 to be tested correctly.

Returning to FIG. 1, the anti-vibration devices SA are disposed on an outer surface of the box body 110 to support the box body 110 to prevent external vibrations from affecting the operation of the antenna measurement. In this embodiment, the anti-vibration devices SA are dampers, but the embodiments of the present invention are not limited thereto.

In addition, in some embodiments, the antenna test system 100 may also apply the anti-vibration devices SA to other devices. For example, the moving device 160 may include an anti-vibration device SA to prevent the vibration generated when the signal measuring device 150 is moved by the moving device 160 from affecting the supporting device 420. For another example, the carrier plate 120 may include an anti-vibration device SA to prevent the supporting device 420 from being affected by the external vibration of the box body 110. In the present embodiment, the anti-vibration devices SA are disposed between the sides of the carrier plate 120 and the box body 110. A surface area of the anti-vibration device SA is slightly greater than a surface area of the side of the carrier plate 120, such that the anti-vibration device SA is not covered by the side of the carrier plate 120, and a portion of the anti-vibration device SA is exposed.

Figure 5:
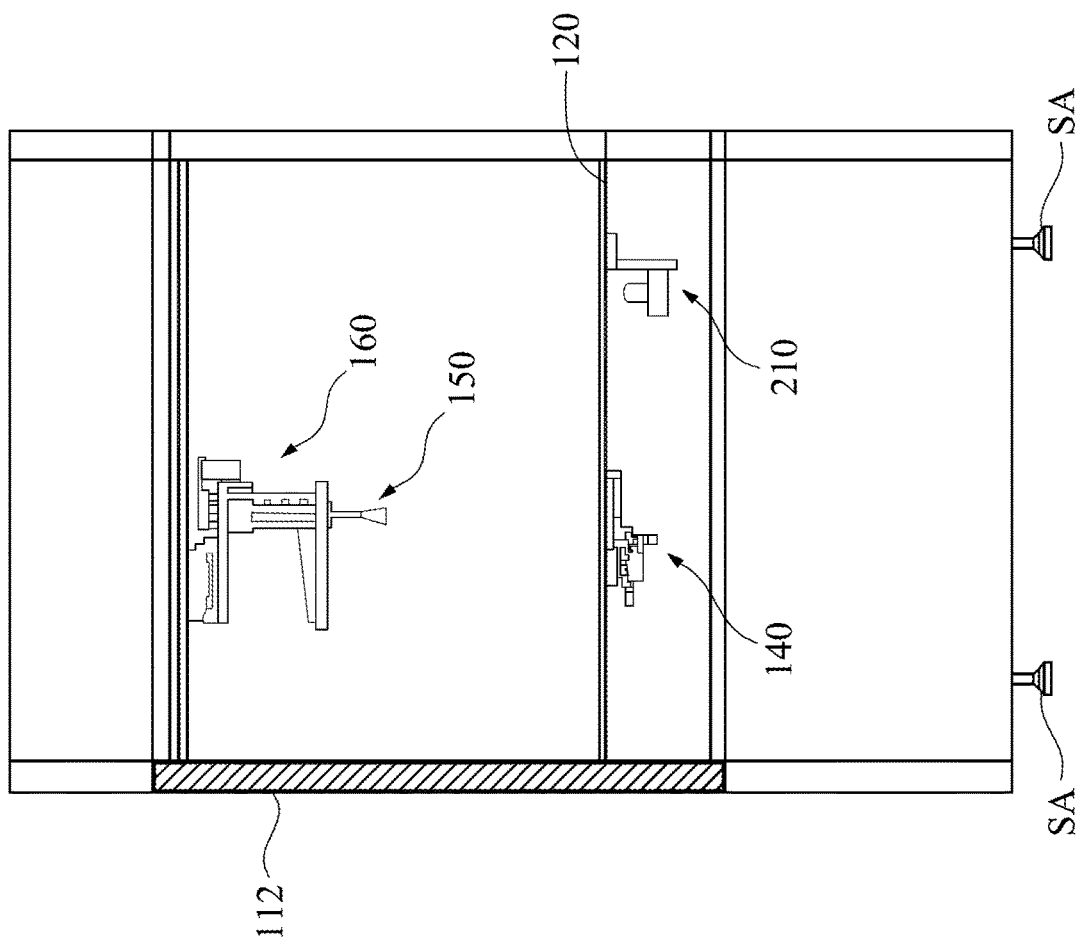
FIG. 5 is a schematic diagram showing a structure of an antenna testing system in accordance with another embodiment of the present invention.

Referring to FIG. 5, a schematic diagram showing a structure of an antenna testing system 500 in accordance with another embodiment of the present invention. The antenna test system 500 of the present embodiment is similar to the antenna test system 100, and a difference is that the carrier plate 120, the supporting device 420, the probing arm 140 (the probe device 141) of the antenna test system 500 are disposed in the lower portion of the box body 110, not the upper portion. Specifically in the present embodiment, the carrier plate 120 is disposed on the lower portion of the box body 110, and the signal measuring device 150 and the moving device 160 are located on the upper portion of the box body 110. During the antenna measurement, the signal measuring device 150 is moved to different positions (coordinates) on the upper portion of the box body 110 by the moving device 160 to measure the antenna working signal of the antenna circuit to be tested, which is carried by the underlying carrier plate 120. For example, the slide rails 164X and 164Y shown in FIG. 3 are disposed on the upper portion of the box body 110, so that the signal measuring device 150 can move on the upper portion of the box body 110 by using the slide rails 164X and 164Y.

In some embodiments, the antenna test system 500 may further include a lifting device, such as the Z-axis lifting platform 162, on the carrier plate 120 to carry the antenna circuit to be tested and to adjust the height of the antenna circuit to be tested. In other embodiments, a rotating mechanism may be provided between the lifting device and the carrier plate 120, such that the lifting device is rotated by the rotating mechanism to adjust the angle of the antenna circuit to be tested.

Figure 6:
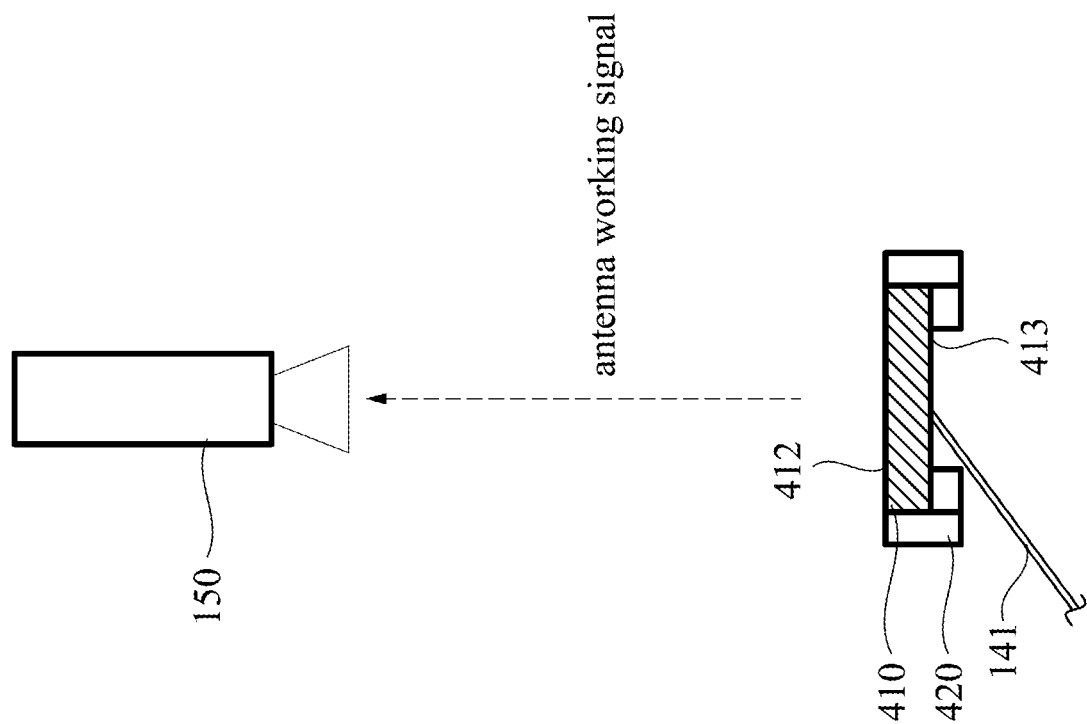
FIG. 6 is a schematic diagram showing an operation of antenna measurement in accordance with one embodiment of the present invention.

Referring FIG. 6, a schematic diagram showing an operation of antenna measurement in accordance with one embodiment of the present invention. The antenna measurement operation of the present embodiment corresponds to the antenna test system 500, wherein the probe device 141 contacts the bottom 413 of the antenna circuit 410 to be tested through the opening of the supporting device 420 to apply the antenna test signal from the bottom of the antenna circuit 410 to be tested, so that the antenna circuit 410 to be tested emits the antenna working signal to the signal measuring device 150. In this embodiment, since the probe device 141 applies the antenna test signal from the bottom of the antenna circuit 410 to be tested, the antenna working signal emitted from the top 412 of the antenna circuit 410 to be tested is not affected or shielded by the probe device 141.

Figure 7:
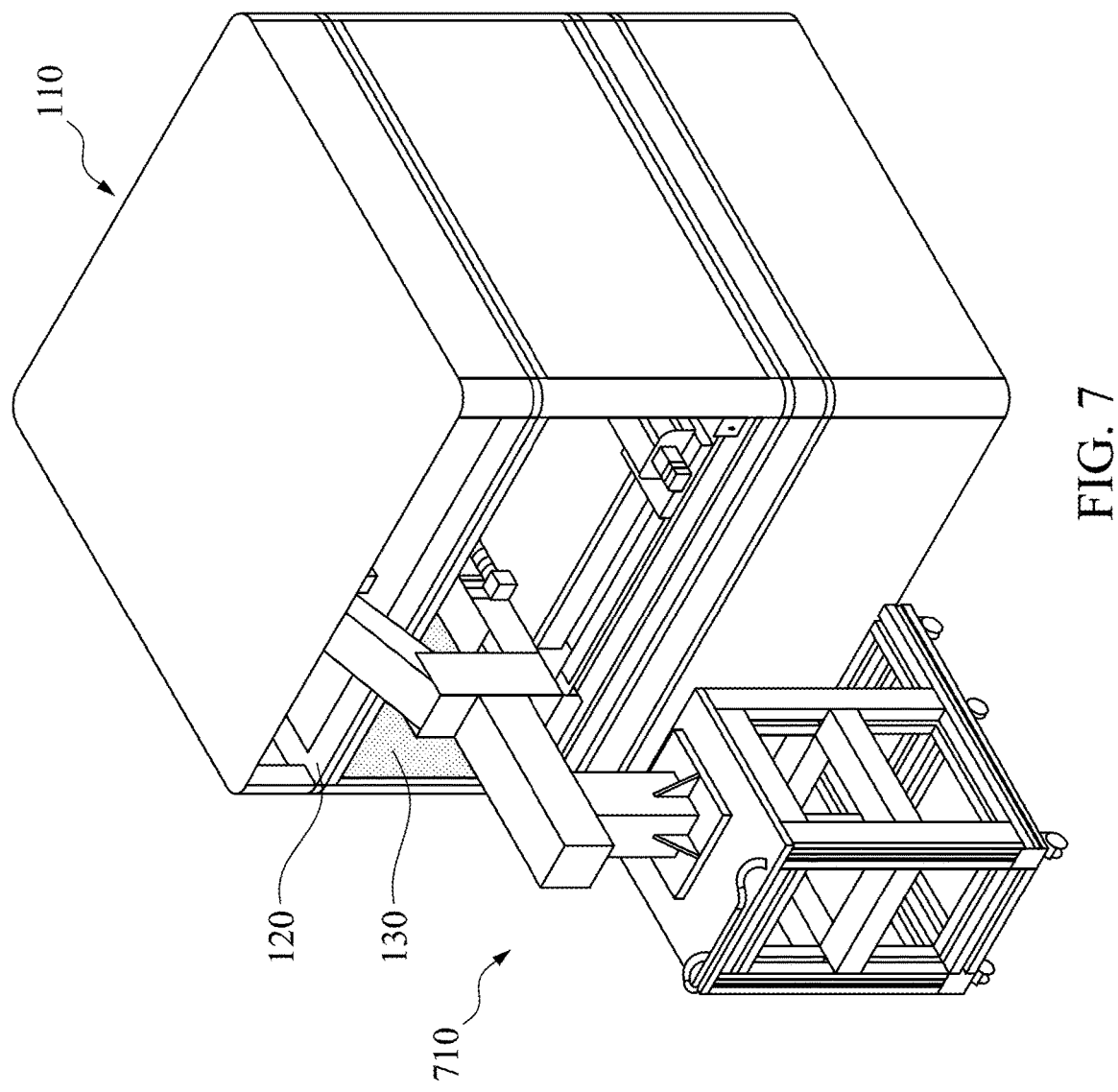
FIG. 7 is a schematic diagram showing a structure of an antenna testing system in accordance with still another embodiment of the present invention.

Referring FIG. 7, a schematic diagram showing a structure of an antenna testing system 700 in accordance with yet another embodiment of the present invention. The antenna test system 700 is similar to the antenna test system 100, except that the antenna test system 700 utilizes a mobile observation platform 710 to provide a microscope. The microscope is used for confirming the contact status of the probe device. The mobile observation platform 710 is arranged outside the box body 110, and a Y-shaped support arm 712 of the mobile observation platform 710 is moved into the box body 110 to provide a microscope before performing antenna measurement, as shown in FIG. 8 and FIG. 9.

Figure 8:
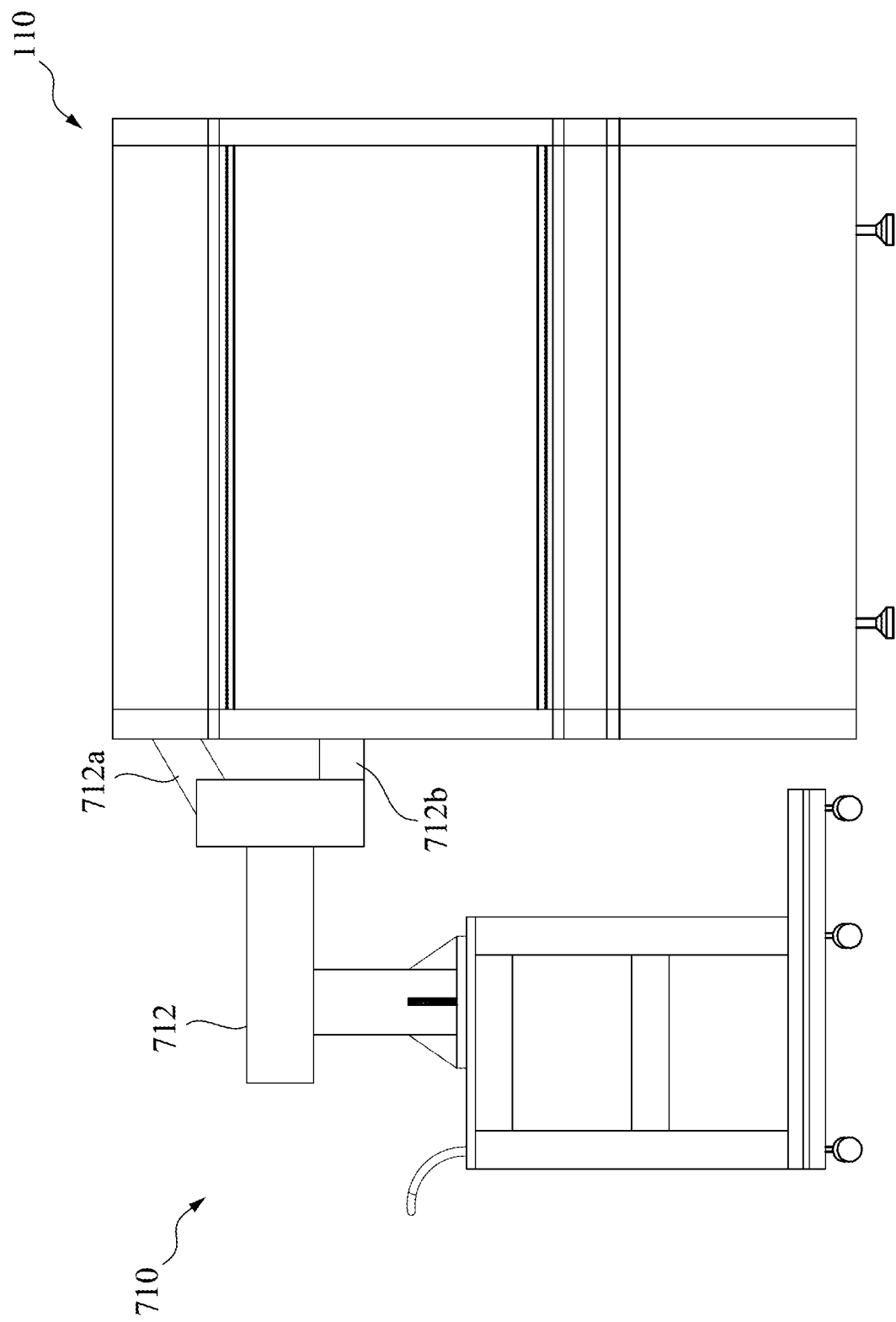
FIG. 8 and FIG. 9 are schematic diagrams showing antenna measurement by using a mobile observation platform in accordance with one embodiment of the present invention.
Figure 9:
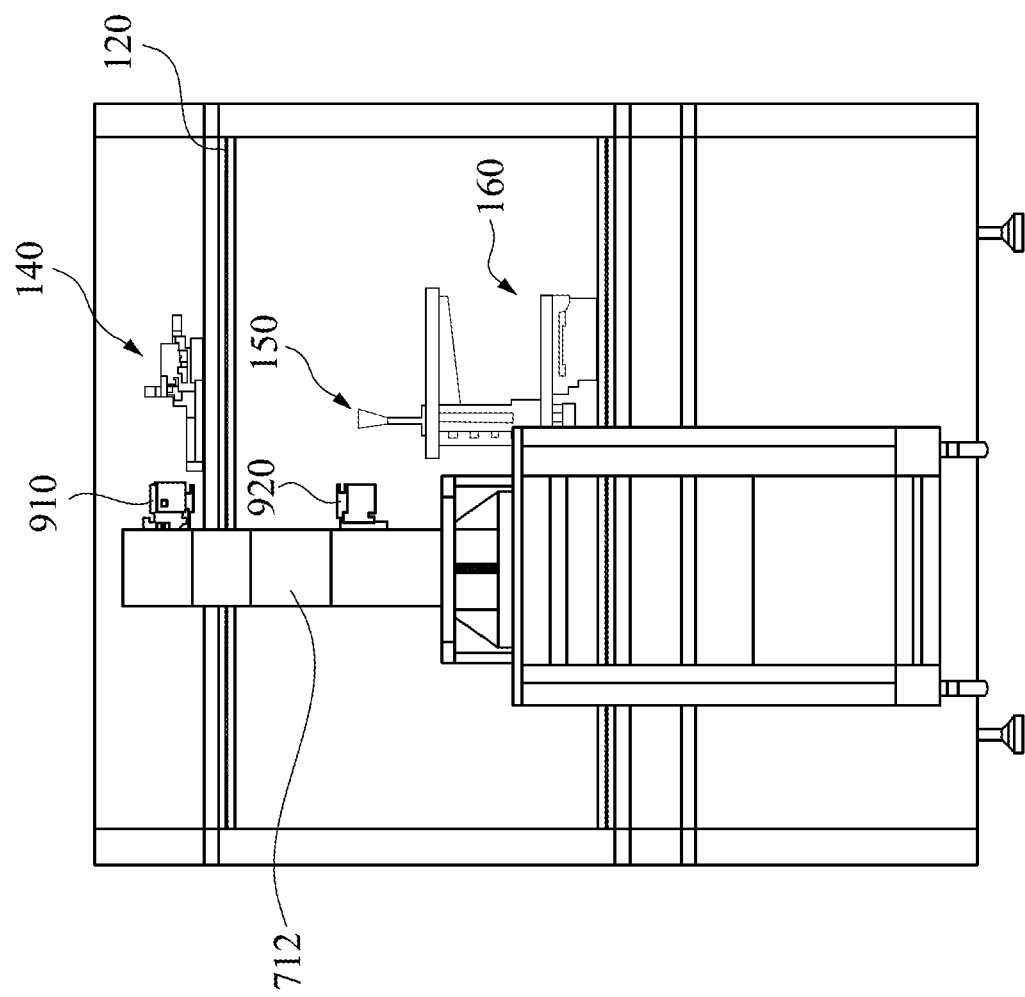

In FIG. 8 and FIG. 9, two support bases 712a and 712b extending from the Y-shaped support arm 712 are respectively located above and below the carrier plate 120 when the Y-shaped support arm 712 of the mobile observation platform 710 is inside the box body 110. For example, the support bases 712a and 712b of the Y-shaped support arm 712 are provided with a front-view microscope 910 and a rear-view microscope 920, wherein the front-view microscope 910 is located above the carrier plate 120 to capture images from above the carrier plate 120, and the rear-view microscope 920 is located below the carrier plate 120 to capture images from below the carrier plate 120.

In some embodiments, the Y-shaped support arm 712 may further include a rotating mechanism, and the Y-shaped support arm 712 can be rotated by the rotating mechanism, such that the support bases 712a and 712b may be rotated to exchange positions. For example, the support base 712a can be moved to the bottom of the carrier plate 120 by rotating, and the support base 712b can be moved to the top of the carrier plate 120 at the same time. The Y-shaped support arm 712 of the mobile observation platform 710 may only carry one microscope, such as the front-view microscope 910 or the rear-view microscope 920. The rotating mechanism may be used to adjust the position of the microscope to meet the needs of the user.

Although the present invention has been described above with the embodiments, it is not intended to limit the present invention. Any person having ordinary skill in the art can make various variations and modifications without departing from the scope or spirit of the present invention. Therefore, the scope of the present invention shall be determined by the appended claims.

What is claimed is:

1. An antenna test system, comprising:
   a box body including an operation side having an opening that may be opened movably;
   a supporting device disposed in the box body and configured to carry an antenna circuit to be tested;
   at least one probe device disposed in the box body and configured to apply an antenna testing signal to the antenna circuit to be tested to emit an antenna working signal;
   a signal measuring device disposed in the box body and configured to receive the antenna working signal emitted from the antenna circuit to be tested; and
   a moving device disposed in the box body and configured to carry the signal measuring device and to at least maneuver in three directions of X-axis, Y-axis, and Z-axis, such that the signal measuring device may receive the antenna working signal in different measuring positions according to a predetermined time sequence,
   wherein after the antenna circuit to be tested is moved from outside the box body to a predetermined test position inside the box body, the probe device is disposed on a probing arm, such that the probe device is moved by the probing arm to a predetermined contact position to apply the antenna testing signal to the antenna circuit to be tested.

2. The antenna test system of claim 1, further comprising:
   at least one first slide rail disposed on at least one side wall of the box body and extended along a direction towards the opening of the box body; and
   a carrier plate, wherein at least one end of the carrier plate is disposed on the at least one first slide rail to move along the at least one first slide rail; and wherein the carrier plate carries the supporting device and the probe device, and when the carrier plate moves toward the opening of the box body along the at least one first slide rail, at least one portion of the carrier plate, the supporting device, and the probe device are exposed outside the box body.

3. The antenna test system of claim 2, wherein the moving device comprises a second slide rail disposed on an upper portion of the box body; and the signal measuring device is disposed on the second slide rail to move to different positions to receive the antenna working signal.

4. The antenna test system of claim 2, wherein the carrier plate further comprises an anti-vibration device for preventing the supporting device from being affected by external vibration of the box body.

5. The antenna test system of claim 2, further comprising a lifting device disposed on the carrier plate to carry the supporting device, and configured to adjust a Z-axis coordinate position of the antenna circuit to be tested.

6. The antenna test system of claim 1, wherein the supporting device and the probe device are disposed on an upper portion of the box body.

7. The antenna test system of claim 6, wherein the moving device comprises a slide rail disposed on a lower portion of the box body; and the signal measuring device is disposed on the slide rail to move to different positions to receive the antenna working signal.

8. The antenna test system of claim 7, further comprising a mobile observation platform disposed outside the box body and configured to carry at least one microscopic observation device to check whether the probe device contacts the antenna circuit to be tested correctly;
wherein
when observing a contact state between the antenna circuit to be tested and the probe device, the mobile observation platform extends into the box body from the opening of the operation side of the box body; and
after observing, the mobile observation platform exits the box body through the opening.

9. The antenna test system of claim 8, wherein the mobile observation platform further comprises a Y-shaped support arm, two support bases extend from the Y-shaped support arm, the at least one microscopic observation device comprises a front-view microscope and a rear-view microscope, and the support bases respectively carry the front-view microscope and the rear-view microscope.

10. The antenna test system of claim 8, wherein the mobile observation platform further comprises a rotatable support arm, the at least one microscopic observation device is a microscope, and the rotatable support arm carries the microscope to rotate to a front-view position or a rear-view position.

11. The antenna test system of claim 1, wherein the moving device further comprises an anti-vibration device for preventing vibration generated when the signal measuring device is moved by the moving device from affecting the supporting device.

12. An antenna test system, comprising:
a box body including an operation side having an opening that may be opened movably;
a supporting device disposed in the box body and configured to carry an antenna circuit to be tested;
at least one probe device disposed in the box body and configured to apply an antenna testing signal to the antenna circuit to be tested to emit an antenna working signal;
a signal measuring device disposed in the box body and configured to receive the antenna working signal emitted from the antenna circuit to be tested;
a moving device disposed in the box body and configured to carry the signal measuring device and to at least maneuver in three directions of X-axis, Y-axis, and Z-axis to make the signal measuring device receive the antenna working signal in different positions; and
a mobile observation platform disposed outside the box body and configured to carry at least one microscopic observation device to check whether the probe device contacts the antenna circuit to be tested correctly.

13. The antenna test system of claim 12, wherein the supporting device and the probe device are disposed on an upper portion of the box body.

14. The antenna test system of claim 13, wherein the mobile observation platform further comprises a Y-shaped support arm, two support bases extend from the Y-shaped support arm, the at least one microscopic observation device comprises a front-view microscope and a rear-view microscope, and the support bases respectively carry the front-view microscope and the rear-view microscope.

15. The antenna test system of claim 13, wherein the mobile observation platform further comprises a rotatable support arm, the at least one microscopic observation device is a microscope, and the rotatable support arm carries the microscope to rotate to a front-view position or a rear-view position.

* * * * *